United States Patent [19]
Kubo et al.

[11] Patent Number: 6,118,730
[45] Date of Patent: *Sep. 12, 2000

[54] PHASE COMPARATOR WITH IMPROVED COMPARISON PRECISION AND SYNCHRONOUS SEMICONDUCTOR MEMORY DEVICE EMPLOYING THE SAME

[75] Inventors: Takashi Kubo; Yasumitsu Murai; Hisashi Iwamoto, all of Hyogo, Japan

[73] Assignees: Mitsubishi Denki Kabushiki Kaisha; Mitsubishi Electric Engineering Company Limited, both of Tokyo, Japan

[ * ] Notice: This patent is subject to a terminal disclaimer.

[21] Appl. No.: 09/295,361

[22] Filed: Apr. 21, 1999

[30] Foreign Application Priority Data

Oct. 26, 1998 [JP] Japan .................................. 10-304242

[51] Int. Cl.[7] ...................................................... G11C 8/00
[52] U.S. Cl. .................... 365/233; 365/189.07; 365/194; 327/2; 327/3
[58] Field of Search .............................. 365/233, 189.05, 365/189.07, 194; 327/2, 3, 7, 8

[56] References Cited

U.S. PATENT DOCUMENTS 5,940,344  8/1999  Murai et al. ............................. 365/233

*Primary Examiner*—Son T. Dinh
*Assistant Examiner*—Hien Nguyen
*Attorney, Agent, or Firm*—McDermott, Will & Emery

[57] ABSTRACT

The phase comparator receives an output of a buffer receiving the first input signal and an output of a buffer receiving the second input signal, and outputs signals SLOW, FAST as a result of phase comparison. The phase comparator includes a waveform processing circuit for enlarging the phase difference between two input signals, and a comparison circuit for performing phase comparison based on the phase difference enlarged by the waveform processing circuit and outputting signals SLOW, FAST. Because of the function of the waveform processing circuit, the performance of the phase comparator can be improved significantly, without having to largely improve the performance of the comparison circuit.

17 Claims, 13 Drawing Sheets

PHASE COMPARATOR WITH IMPROVED COMPARISON PRECISION AND SYNCHRONOUS SEMICONDUCTOR MEMORY DEVICE EMPLOYING THE SAME

BACKGROUND OF THE INVENTION

1. Field of the Invention

The present invention relates to a phase comparator, and more particularly to a phase comparator included in a clock generating circuit for generating an internal clock signal in synchronization with an external clock signal in a synchronous semiconductor memory device for sending and receiving data in synchronization with the external clock signal.

2. Description of the Background Art

In recent years, systems have been increased in speed. A dynamic random access memory (DRAM) as a main memory has also been speeded with the introduction of a synchronous dynamic random access memory (hereinafter, referred to as an SDRAM) that operates in synchronization with a system clock.

To satisfy data rate demanded by systems, however, the DRAMs as well as microprocessor units (MPU) are required to operate even more rapidly. When sending and receiving data at high speed, windows for the data (i.e., time width in which data are to be transmitted on a bus) are extremely narrowed. Thus, it is necessary to synchronize an external clock signal and an internal clock signal without error such that data are input/output with accurate timing.

For synchronizing clock signals, a delay locked loop (DLL) circuit, for example, is used to generate an internal clock signal based on an external clock signal. In the DLL circuit, a phase comparator should be provided for comparing phases of the external clock signal and the generated internal clock signal so as to successfully generate the internal clock signal in phase-synchronization with the external clock signal.

According to a conventional phase comparator, however, precision in phase comparison is limited due to switching time of a transistor being its component element, inversion time of a latch, difference in load capacitance, and so on. Such limit in detection of the phase comparator has made difficult to dramatically improve the precision of phase comparator.

Thus, in an SDRAM incorporating an internal clock generating circuit having such phase comparator therein, high-speed operation cannot be realized with increased clock frequency.

SUMMARY OF THE INVENTION

An object of the present invention is to significantly improve comparison precision of a phase comparator.

Another object of the present invention is to provide a synchronous semiconductor memory device capable of generating an internal clock that is stable with respect to a high-speed external clock and of realizing a stable operation, by improving the performance of phase comparator.

In summary, a phase comparator according to an aspect of the present invention includes a waveform processing circuit and a comparison circuit.

The waveform processing circuit modifies, based on a phase difference between a first input signal and a second input signal, a waveform of at least one of the first and second input signals to enlarge their phase difference for application to first and second internal nodes, respectively.

The waveform processing circuit includes a first gate circuit for transmitting the first input signal to the first internal node when the first input signal makes a transition prior to the second input signal, and for connecting the first internal node to a power supply node when the second input signal makes a transition ahead of the first input signal, and a second gate circuit for transmitting the second input signal to the second internal node when the second input signal makes a transition before the first input signal, and connecting the second internal node to the power supply node when the first input signal makes a transition prior to the second input signal. The comparison circuit performs phase comparison of the first and second input signals based on potentials of the first and second internal nodes.

According to another aspect of the present invention, the phase comparator is provided with a waveform processing circuit and a comparison circuit as follows. The waveform processing circuit modifies, based on a phase difference between a first input signal and a second input signal, a waveform of at least one of the first and second input signals to enlarge their phase difference for providing to first and second internal nodes, respectively. The waveform processing circuit includes: a first gate circuit for transmitting the first input signal to the first internal node when the first input signal makes a transition before the second input signal, and connecting a capacitive load to the first internal node when the second input signal makes a transition prior to the first input signal; and a second gate circuit for transmitting the second input signal to the second internal node when the second input signal makes a transition prior to the first input signal, and connecting a capacitive load to the second internal node when the first input signal makes a transition prior to the second input signal. The comparison circuit performs phase comparison of the first and second input signals according to potentials of the first and second internal nodes.

According to a further aspect of the present invention, a synchronous semiconductor memory device for taking in a control signal and an address signal in synchronization with an external clock signal and performing input/output of a data signal is provided with a memory cell array, an output circuit, and an internal clock generating circuit. The memory cell array includes a plurality of memory cells arranged in a matrix. The output circuit outputs data held in the memory cells in synchronization with an internal clock signal that is synchronized in phase with the external clock signal. The internal clock generating circuit generates the internal clock signal synchronized in phase with the external clock signal. The internal clock generating circuit includes: a delay control circuit for controlling generation of the internal clock from the external clock; a delay line controlled by the delay control circuit for delaying the external clock signal and outputting the internal clock; and a phase comparator for detecting a phase difference between the external clock signal and the internal clock signal and outputting the result of detection to the delay control circuit. The phase comparator includes a waveform processing circuit for modifying, based on a phase difference between a first input signal generated according to the external clock signal and a second input signal generated according to the internal clock signal, a waveform of at least one of the first and second input signals to enlarge the phase difference for application to first and second internal nodes, respectively. The waveform processing circuit includes: a first gate circuit for transmitting the first input signal to the first internal node when the first input signal makes a transition prior to the second input signal, and connecting the first internal node to a power supply node when the second input signal makes a transition prior to the first input signal; and a second gate circuit for transmitting the second input signal to the second internal node when the second input signal makes a transition prior to the first input signal, and connecting the second internal node to the power supply node when the first input signal makes a transition prior to the second input signal. The phase comparator further includes a comparison circuit for performing phase comparison between the first and second input signals based on potentials of the first and internal nodes.

Accordingly, a primary advantage of the present invention is that the precision of phase comparator can be significantly improved without altering the precision of comparison circuit, because in the waveform processing circuit, the phase difference between the two input signals is enlarged before it is determined by the comparison circuit.

Another advantage of the present invention is that a highly precise, stable phase comparison operation can be realized without causing malfunction, because, in response to one signal that made a transition in advance, the other signal is delayed by connecting a load capacitance thereto, while the load capacitance provided for the signal that changed first is separated therefrom.

A still further advantage of the present invention is that the precision of phase comparator can be significantly improved with the same precision of comparison circuit, so that it can be used with a high-speed clock signal. This is because, in the waveform processing circuit included in the phase comparator of the clock generating circuit, the phase difference of the two input signals is enlarged before determined by the comparison circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
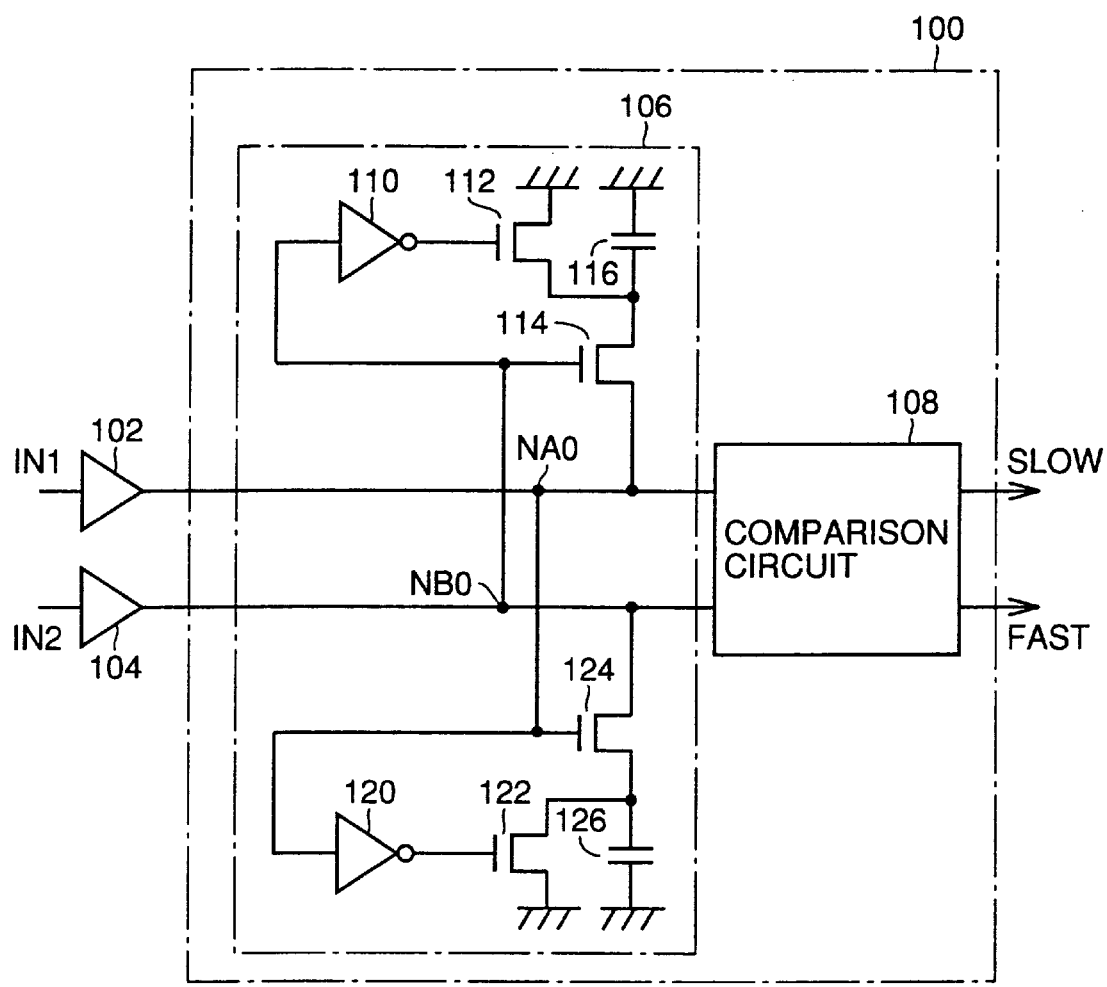
FIG. 1 is a circuit diagram showing a configuration of a phase comparator 100 as an object of consideration for improvement.

Hereinafter, embodiments of the present invention will be described with reference to the accompanying drawings, in which same or corresponding components are denoted by same reference characters.

First Embodiment

In a phase comparator, phase comparison precision tends to be limited due to switching time of the transistor as its component element, inversion time of the latch, difference in the load capacitance, and so on. Thus, there exists a limit in detection of phase difference, which limit is essentially difficult to improve dramatically.

In such phase comparator, if a circuit to amplify the phase difference is employed in the preceding stage of a comparison circuit, it becomes possible to significantly improve the precision of the entire phase comparator, without having to alter the precision of comparison circuit per se. It should be understood, however, that the DLL circuit including the phase comparator is very complex in configuration, and thus, it is important to make it hardly cause malfunction.

FIG. 1 is a circuit diagram illustrating a configuration of a phase comparator 100 that is an exemplary object of consideration for improvement.

Referring to FIG. 1, phase comparator 100 receives an output of a buffer 102 receiving a signal IN1 and an output of a buffer 104 receiving a signal IN2, compares their phases, and outputs signals SLOW, FAST as a result of comparison. Phase comparator 100 includes a waveform processing circuit 106, and a comparison circuit 108 receiving the output of waveform processing circuit 106 and outputting signals SLOW, FAST.

In waveform processing circuit 106, the output of buffer 102 is connected to a node NA0, and the output of buffer 104 to a node NB0. Waveform processing circuit 106 includes: an inverter 110 having its input connected with node NB0; an N channel MOS transistor 112 having its gate receiving the output of inverter 110 and its source connected to a ground node; a capacitor 116 connected between the ground node and the drain of N channel MOS transistor 112; and an N channel MOS transistor 114 connected between the drain of N channel MOS transistor 112 and node NA0 and having its gate connected with node NB0.

Waveform processing circuit 106 further includes: an inverter 120 having its input connected with node NA0; an N channel MOS transistor 122 having its gate receiving the output of inverter 120 and its source connected to the ground node; a capacitor 126 connected between the drain of N channel MOS transistor 122 and the ground node; and an N channel MOS transistor 124 connected between the drain of N channel MOS transistor 122 and node NB0 and having its gate connected with node NA0.

Comparison circuit 108 performs phase comparison operation based on the waveforms generated at nodes NA0, NB0.

Figure 2:
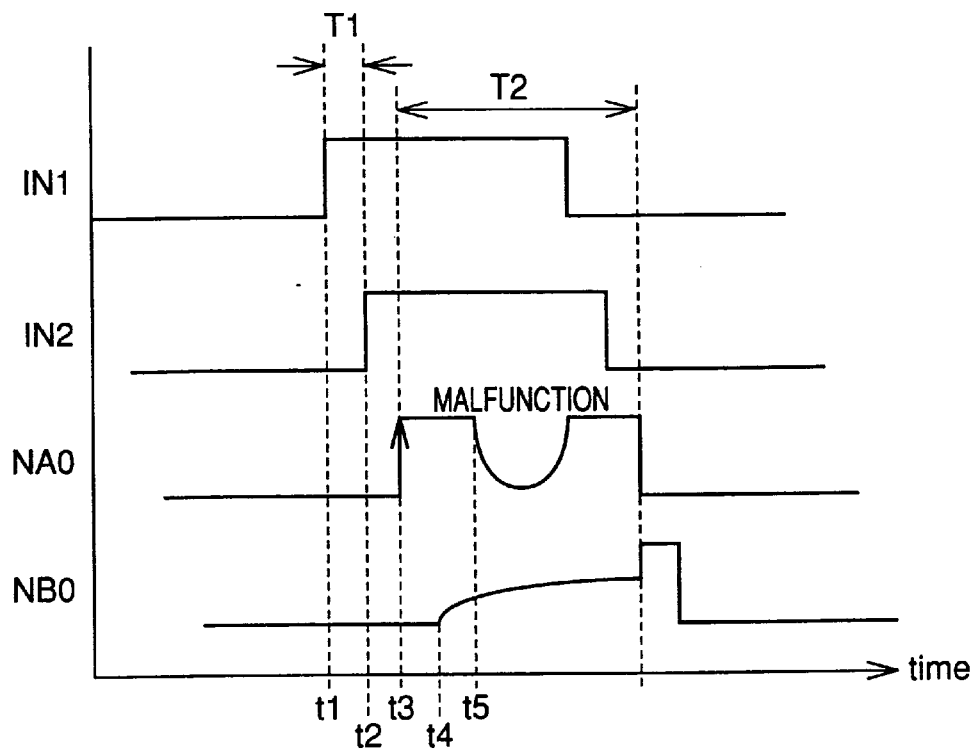
FIG. 2 shows waveforms illustrating the operation of a waveform processing circuit 106 shown in FIG. 1.

FIG. 2 shows waveforms illustrating the operation of the waveform processing circuit shown in FIG. 1.

With reference to FIGS. 1 and 2, signal IN1 rises at time t1 and signal IN2 rises at time t2.

The potential at node NA0 rises in response to the rising of signal IN1 at time t3 after a delay time due to buffer 102 has passed. In response, N channel MOS transistor 124 is rendered conductive, and capacitor 126 is connected to node NB0. At this time, N channel MOS transistor 122 is in a non-conductive state.

At time t4, the potential at node NB0 starts to rise after a delay time due to buffer 104 has passed. This rising takes more time than in the case of node NA0 because capacitor 126 is connected. Accordingly, the phase difference at the rising of signals IN1, IN2 is enlarged on nodes NA0, NB0.

At time t5, however, when the potential of node NB0 reaches a level sufficient to render N channel MOS transistor 114 conductive, capacitor 116 is connected to node NA0, which may cause the potential of node NA0 to drop momentarily. Whether this phenomenon occurs or not depends on a relation between the driving capability of buffers 102, 104 and the size of capacitors 116, 126. Generally, the rising time difference T1 between signals IN1 and IN2 is supposed to be enlarged to time difference T2 on nodes NA0, NB0. In the case where such waveform is generated at node NA0, however, comparison circuit 108 is unable to determine a correct phase difference, which causes malfunction.

Figure 3:
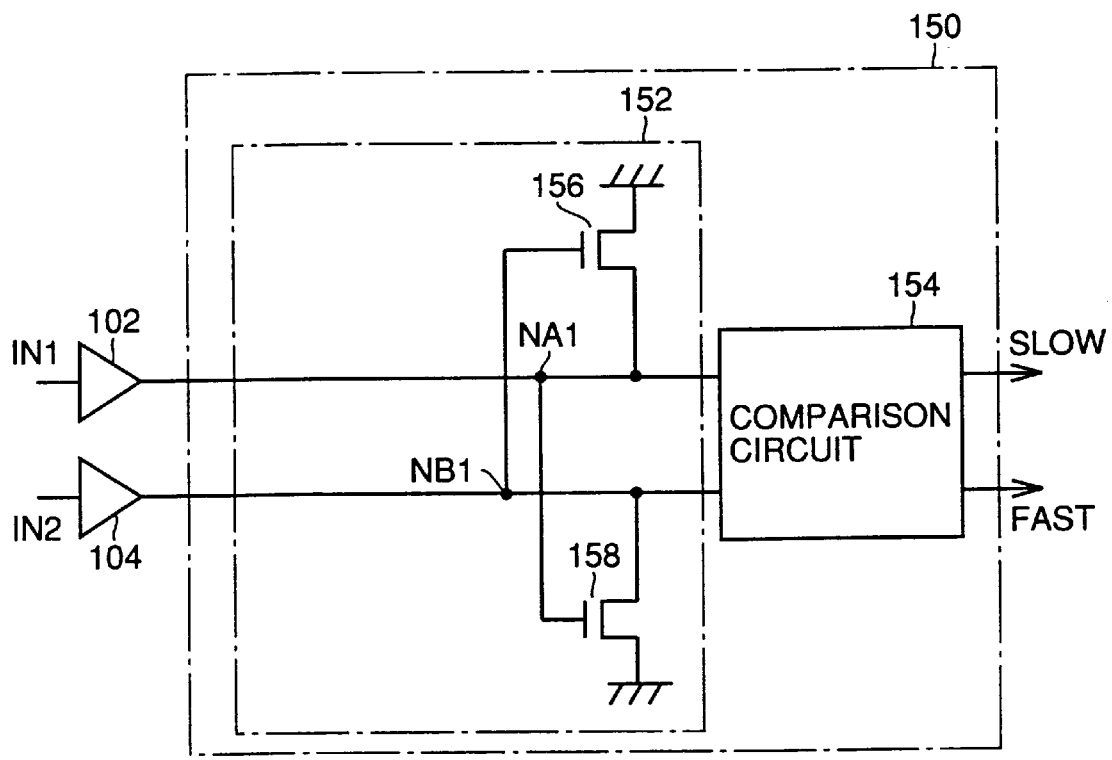
FIG. 3 is a circuit diagram showing a configuration of a phase comparator 150 according to a first embodiment of the present invention.

FIG. 3 is a circuit diagram showing the configuration of a phase comparator 150 according to the first embodiment of the present invention.

With reference to FIG. 3, phase comparator 150 receives outputs of buffer 102 receiving input signal IN1 and of buffer 104 receiving input signal IN2, and outputs signals SLOW, FAST as a result of phase comparison.

Phase comparator 150 includes a waveform processing circuit 152 receiving the output signals of buffers 102 and 104 and enlarging their phase difference, and a comparison circuit 154 performing phase comparison based on the phase difference enlarged by waveform processing circuit 152 and outputting signals SLOW, FAST.

Waveform processing circuit 152 includes an N channel MOS transistor 156 connected between node NA1 and the ground node and having its gate connected with node NB1, and an N channel MOS transistor 158 connected between node NB1 and the ground node and having its gate connected with node NA1. Node NA1 is connected with the output of buffer 102 and the first input of comparison circuit 154. Node NB1 is connected with the output of buffer 104 and the second input of comparison circuit 154.

Figure 4:
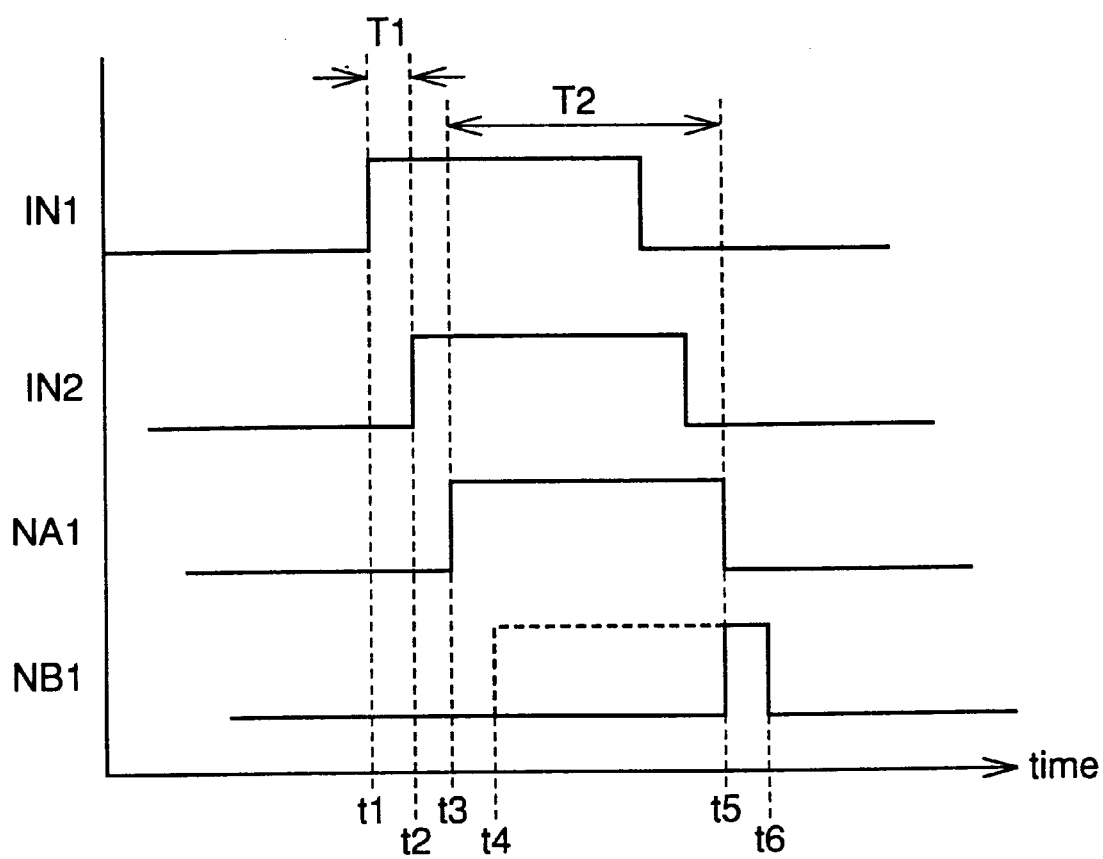
FIG. 4 shows waveforms illustrating the operation of a waveform processing circuit 152 shown in FIG. 3.

FIG. 4 shows waveforms illustrating the operation of waveform processing circuit 152 shown in FIG. 3.

With reference to FIGS. 3 and 4, signal IN1 rises at time t1, and signal IN2 rises at time t2. Here, the time difference between the rising of signal IN1 and of signal IN2 is expressed as T1. At time t3, after a delay time due to buffer 102 has passed, the potential of node NA1 goes from an "L (low)" level to an "H (high)" level. In response, N channel MOS transistor 158 is rendered conductive, and node NB1 is connected to the ground node.

At time t4, after a lapse of delay time due to buffer 104, normally signal IN2 is transmitted to node NB1 (as shown by a dotted line in FIG. 4). Since node NB1 is connected to the ground node by N channel MOS transistor 158, however, the potential of node NB1 remains at an L level.

At time t5, the potential of node NA1 falls according to the change in signal IN1. In response, N channel MOS transistor 158 is rendered non-conductive. The potential of node NB1 thus rises to an H level by the function of buffer 104. At time t6, the potential of node NB1 falls in response to the change in signal IN2.

Waveform processing circuit 152 thus serves to enlarge the rising time difference that was T1 at input to T2.

Figure 5:
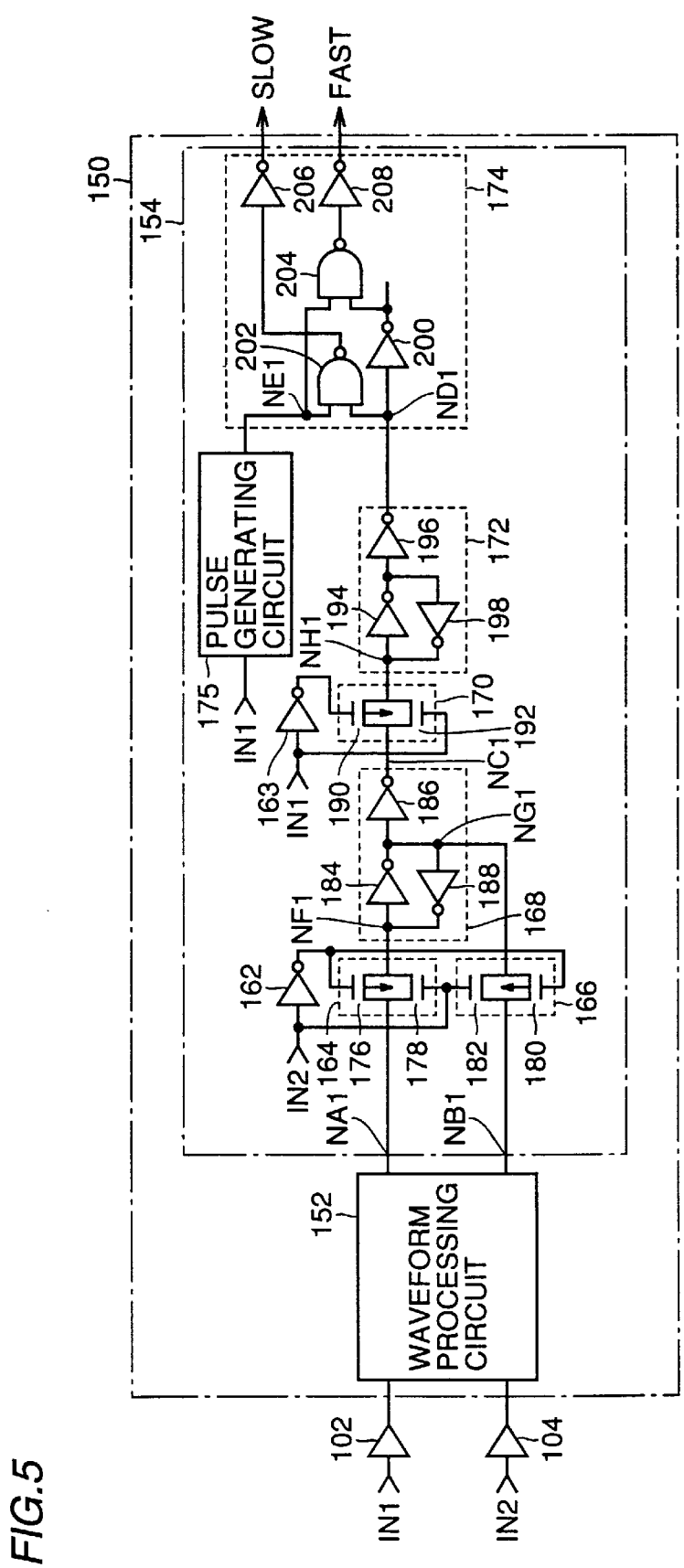
FIG. 5 is a circuit diagram showing a configuration of a comparison circuit 154 included in phase comparator 150.

FIG. 5 is a circuit diagram illustrating a configuration of the comparison circuit 154 included in phase comparator 150.

With reference to FIG. 5, comparison circuit 154 includes: an inverter 162 receiving signal IN2; a transmission gate 164 responsive to signal IN2 and the output signal of inverter 162 for connecting node NA1 and a node NF1; a transmission gate 166 responsive to signal IN2 and the output signal of inverter 162 for connecting node NB1 and a node NG1; a latch circuit 168 for latching signals supplied to nodes NF1 and NG1; an inverter 163 receiving and inverting signal IN1; a transmission gate 170 responsive to signal IN1 and the output of inverter 163 for connecting a node NC1 and a node NH1; a latch circuit 172 for latching the signal supplied to node NH1; a pulse generating circuit 175 for generating a pulse based on signal IN1; and a gate circuit 174 receiving outputs of latch circuit 172 and of pulse generating circuit 175 and outputting signals SLOW, FAST.

Transmission gate 164 includes a P channel MOS transistor 176 connected between nodes NA1 and NF1 and receiving the output of inverter 162 at its gate, and an N channel MOS transistor 178 connected between nodes NA1 and NF1 and receiving signal IN2 at its gate. Transmission gate 166 includes an N channel MOS transistor 182 connected between nodes NB1 and NG1 and receiving signal IN2 at its gate, and a P channel MOS transistor 180 connected between nodes NB1 and NG1 and receiving the output of inverter 162 at its gate.

Latch circuit 168 includes an inverter 184 having its input connected to node NF1 and its output connected to node NG1, an inverter 188 having its input connected to node NG1 and its output connected to node NF1, and an inverter 186 having its input connected to node NG1 and its output connected to node NC1.

Transmission gate 170 includes an N channel MOS transistor 192 connected between nodes NC1 and NH1 and receiving signal IN1 at its gate, and a P channel MOS transistor 190 connected between nodes NC1 and NH1 and receiving the output of inverter 163 at its gate.

Latch circuit 172 includes an inverter 194 having its input connected with node NH1, an inverter 198 receiving and inverting the output of inverter 194 and outputting the inverted signal to node NH1, and an inverter 196 receiving and inverting the output of inverter 194. The output of inverter 196 is connected to node ND1.

Gate circuit 174 includes: an inverter 200 having its input connected with node ND1; an NAND circuit 202 having its inputs connected with nodes ND1, NE1, respectively; an inverter 206 receiving and inverting the output of NAND circuit 202 and outputting signal SLOW; an NAND circuit 204 having its inputs connected with node NE1 and the output node of inverter 200, respectively; and an inverter 208 receiving and inverting the output of NAND circuit 204 and outputting signal FAST. Here, node NE1 is supplied with the output signal of pulse generating circuit 175.

Comparison circuit 154 determines that signal IN2 is lagging behind signal IN1 and activates signal SLOW only when signal IN2 makes a transition from an L level to an H level during a time period in which signal IN1 is at an H level. Otherwise, comparison circuit 154 determines that signal IN2 is leading signal IN1.

Now, the operation of this circuit will be described.

Figure 6:
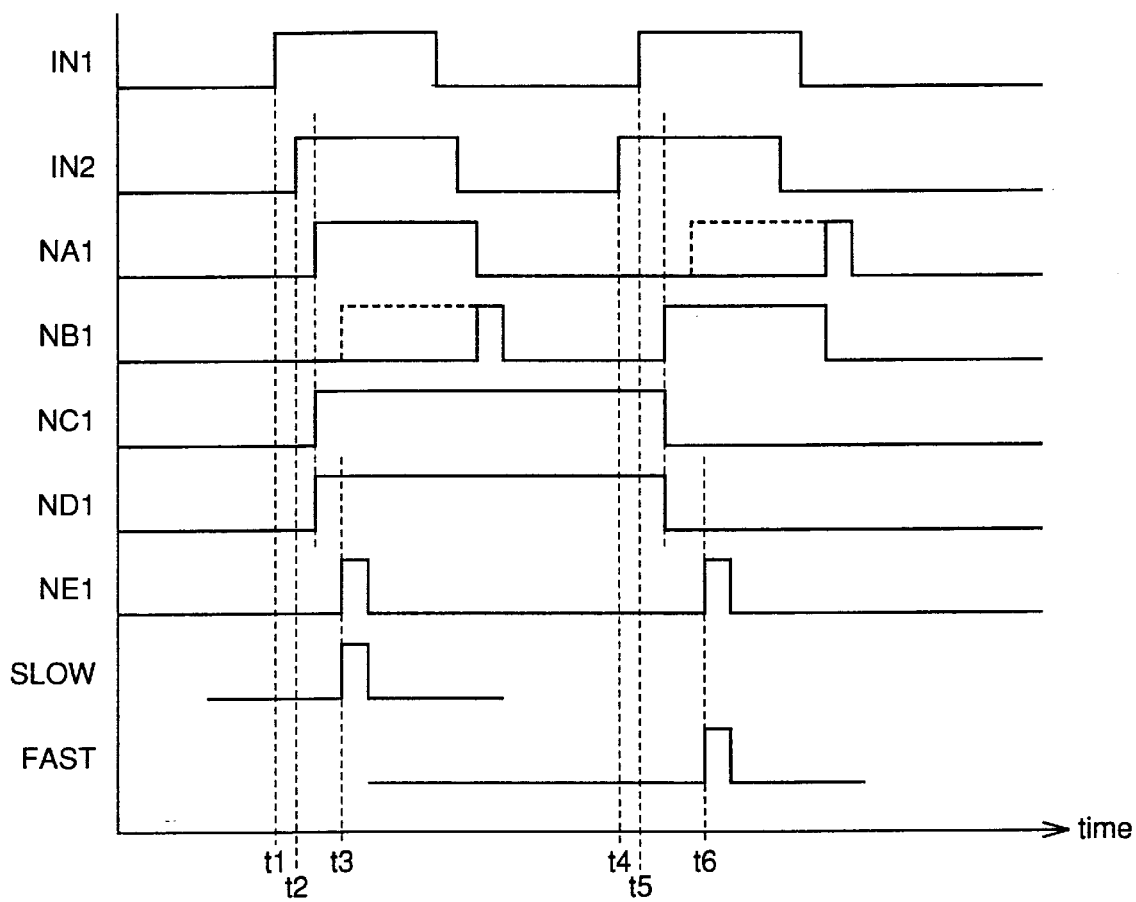
FIG. 6 shows waveforms illustrating the operation of comparison circuit 154 shown in FIG. 5.

FIG. 6 shows waveforms illustrating the operation of comparison circuit 154 shown in FIG. 5.

Referring to FIGS. 5 and 6, signal IN1 rises at time t1, and then, signal IN2 rises at time t2. At time t2, signal IN1 is at an H level. In this case, at time t3, internal node NB1 is at an L level due to the function of waveform processing circuit 152. As a result of taking in this value, internal nodes NC1 and ND 1 are both at an H level. A pulse generated by pulse generating circuit 175 based on signal IN1 is sent from node NE1 via NAND circuit 202 and inverter 206, and is output as signal SLOW.

Now, the case in which signal IN2 rises ahead of signal IN1 will be described.

At time t4, signal IN2 rises. Signal IN1 rises at time t5. In such case, at time t6, internal node NB1 is at an H level due to the function of waveform processing circuit 152. As a result of taking in this value, nodes NC1 and ND1 are both at an L level at time t6 on which a pulse is output from pulse generating circuit 175. That pulse generated and provided to node NE1 is sent via NAND circuit 204 and inverter 208 and is output as signal FAST.

Figure 7:
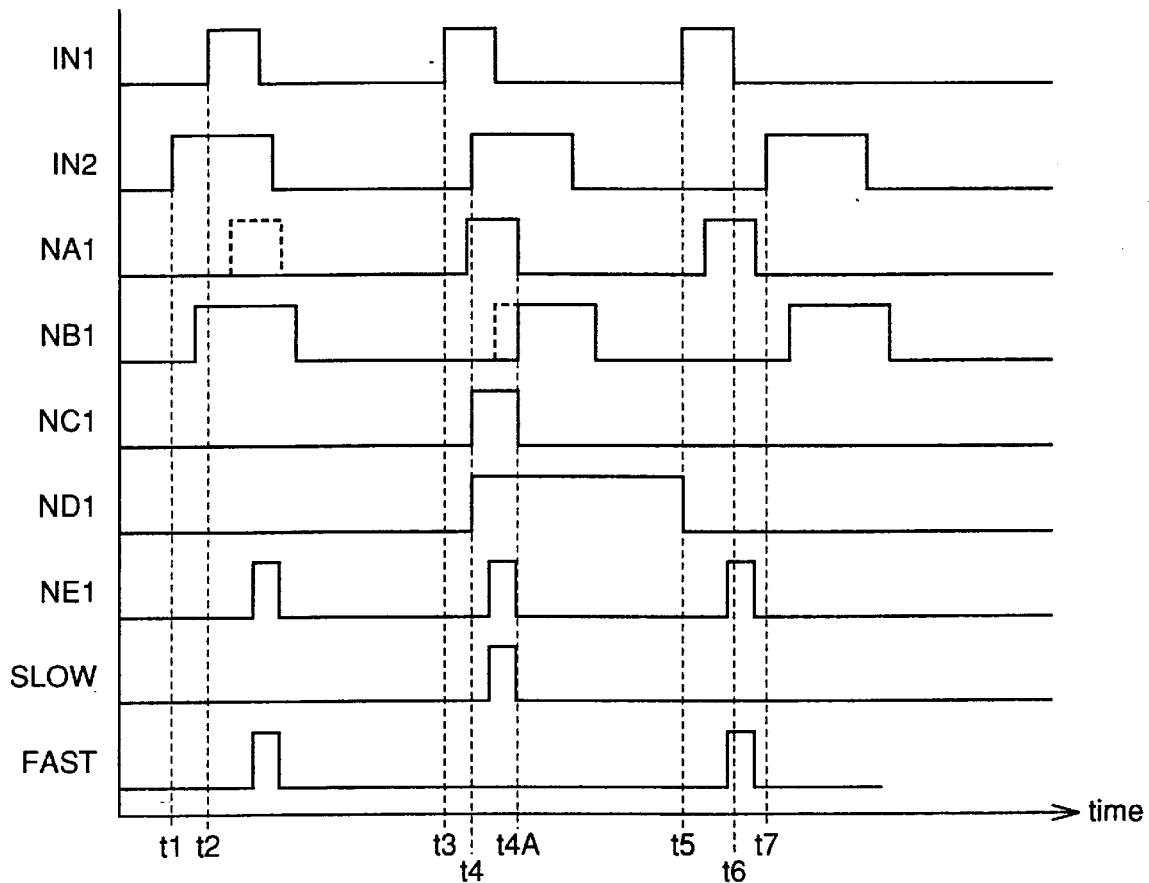
FIG. 7 shows exemplary waveforms illustrating the operation of comparison circuit 154 in the case where input signals IN1 and IN2 have different pulse widths.

FIG. 7 shows exemplary waveforms in phase comparator 154 in the case where input signals IN1 and IN2 have pulse widths different from each other.

Referring to FIGS. 5 and 7, signal IN2 rises at time t1, and subsequently, signal IN1 rises at time t2. In this case, signal IN2 does not rise while signal IN1 is at an H level. Thus, the comparison circuit outputs the pulse signal as signal FAST.

In the case where signal IN1 rises at time t3 and subsequently signal IN2 rises at time t4, nodes NC1 and ND1 both attain the H level, and the pulse signal at node NE1 is output as signal SLOW because of the function of gate circuit 174.

Latch circuit 172 and transmission gate 170 are provided for the purpose of latching the H level of node NC1 corresponding to signal IN1, taking into consideration the case where the output of latch circuit 168 is fixed due to node NC1 that once attains the H level but makes a transition back to the L level, as shown at time t4A.

In the case where signal IN1 rises at time t5 and falls at time t6, and then signal IN2 rises at time t7, signal IN2 does not rise while signal IN1 is at the H level. Thus, the pulse signal generated at node NE1 is output as signal FAST.

In the first embodiment, the phase difference between input signals IN1 and IN2 is amplified in waveform processing circuit 152 having a simple configuration, before determination by comparison circuit 154. Accordingly, the precision of phase comparator can be improved considerably without having to realize a complex circuit configuration.

First Modification of First Embodiment

Figure 8:
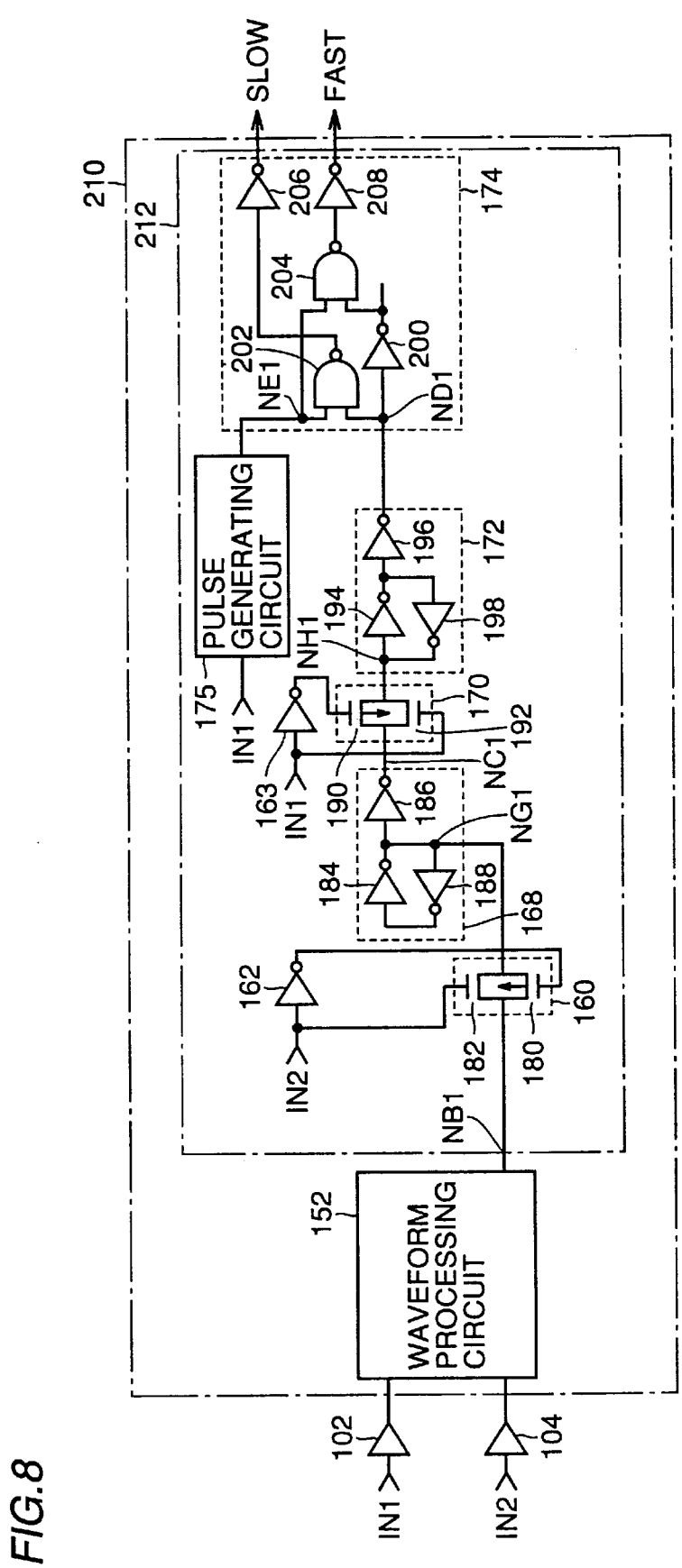
FIG. 8 is a circuit diagram showing a configuration of a phase comparator 210 that is a modification of the first embodiment.

FIG. 8 is a circuit diagram showing a configuration of a phase comparator 210, which is a modification of the first embodiment.

Referring to FIG. 8, phase comparator 210 differs from phase comparator 150 shown in FIG. 5 in that it is provided with a comparison circuit 212 instead of comparison circuit 154. Comparison circuit 212 is different from comparison circuit 154 of FIG. 5 in that transmission gate 164 is removed therefrom. Except this point, it has a configuration identical to that of comparison circuit 154, and therefore, the description thereof is not repeated.

This configuration permits the same operations as in phase comparator 210 of the first embodiment, shown in FIG. 5. Further, the configuration of the comparison circuit therein can be more simplified.

Second Embodiment

Figure 9:
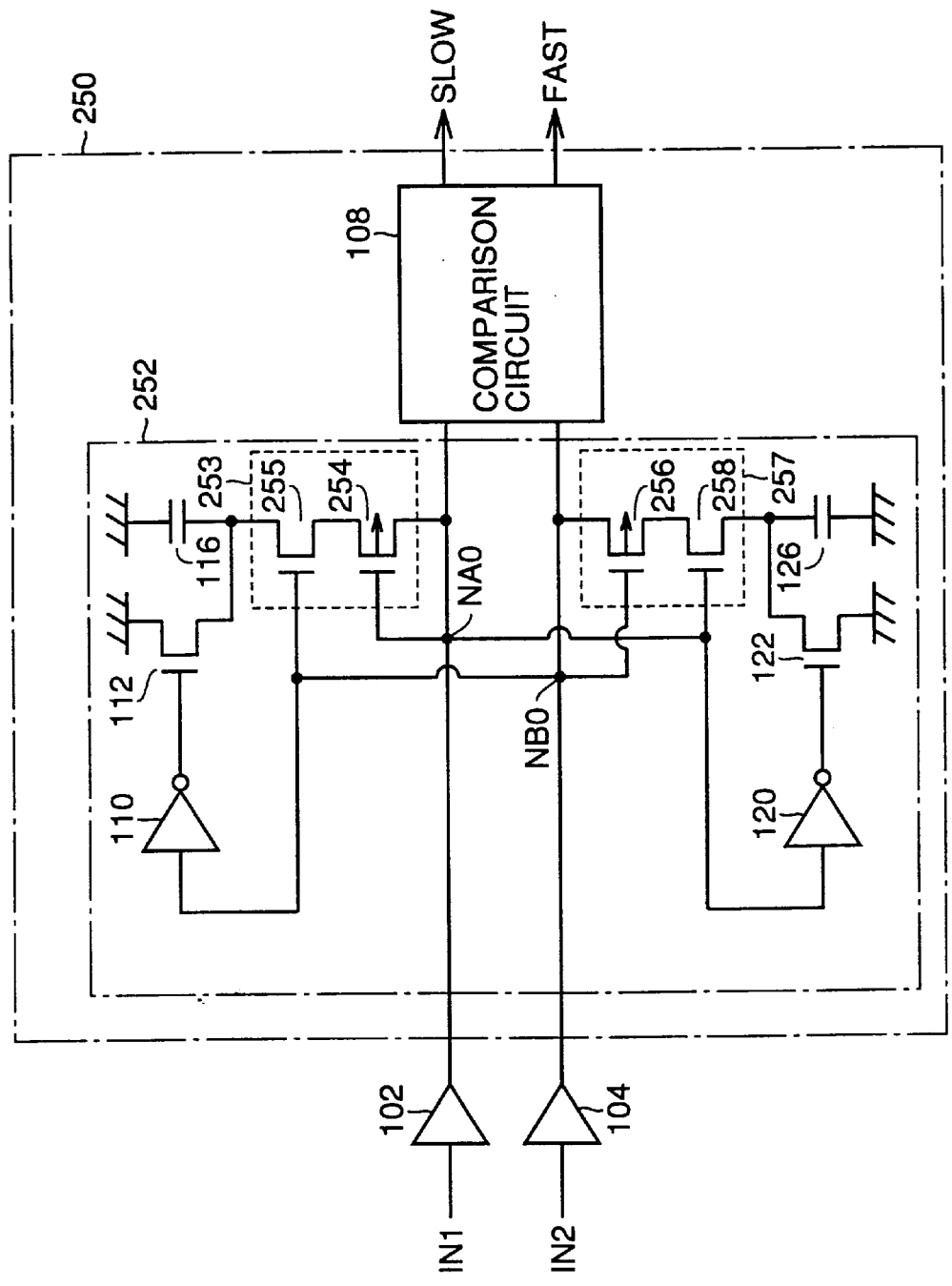
FIG. 9 is a circuit diagram showing a configuration of a phase comparator 250 according to a second embodiment of the present invention.

FIG. 9 is a circuit diagram showing a configuration of a phase comparator 250 according to the second embodiment.

With reference to FIG. 9, phase comparator 250 of the second embodiment includes a waveform processing circuit 252 instead of waveform processing circuit 106 shown in FIG. 1.

Waveform processing circuit 252 has a configuration identical to that of waveform processing circuit 106 shown in FIG. 1, except that it includes a connection circuit 253 instead of N channel MOS transistor 114, and a connection circuit 257 instead of N channel MOS transistor 124.

Connection circuit 253 includes an N channel MOS transistor 255 and a P channel MOS transistor 254 serially connected between the drain of N channel MOS transistor 112 and node NA0 and having their gates connected with nodes NB0 and NA0, respectively.

Connection circuit 257 includes an N channel MOS transistor 258 and a P channel MOS transistor 256 serially connected between the drain of N channel MOS transistor 122 and node NB0, and having their gates connected with nodes NA0 and NB0, respectively.

Phase comparator 250 according to the second embodiment differs from phase comparator 100 shown in FIG. 1 in the above-described points. Other than that, they have configurations identical to each other, and thus, the description will not be repeated.

Figure 10:
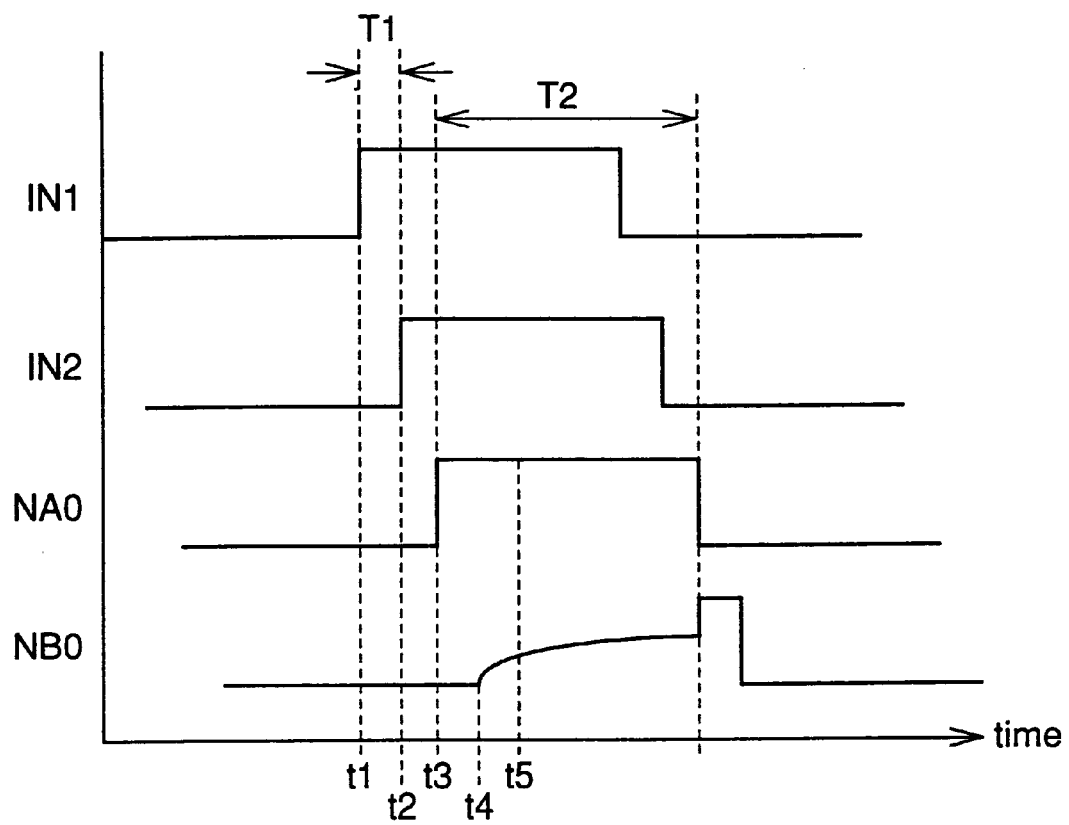
FIG. 10 shows waveforms illustrating the operation of phase comparator 250.

FIG. 10 shows waveforms illustrating the operation of phase comparator 250.

With reference to FIGS. 9 and 10, input signal IN1 rises at time t1 and then signal IN2 rises at time t2. In this case, N channel MOS transistor 258 is rendered conductive in response to the increase of the potential at node NA0, and thus, capacitor 126 is connected to node NB0. At the same time, P channel MOS transistor 254 is rendered non-conductive, and a path for connecting capacitor 116 to node NA0 is cut-off. Therefore, even if the potential of node NB0 increases thereafter, capacitor 116 is prevented from being connected to node NA0.

Accordingly, the malfunction described with reference to FIG. 2 will not occur at time t5. Furthermore, the phase difference T1 between input signals IN1 and IN2 are enlarged to T2 before being provided to comparison circuit 108. Thus, a highly precise, stable phase comparison operation is possible.

In the case of phase comparator according to the second embodiment, in the waveform processing circuit, one of the two input signals that has been input ahead of the other causes capacitance to be added to the node transmitting the other input signal. Thus, the comparison of the signals is made possible even when the two signals are input with their difference in excess of the detection limit of the comparison circuit located in the successive stage. Furthermore, to prevent malfunction, the signal input ahead of the other not only adds capacitance to the transmission node for the other input signal, but also causes a switch to operate to cut off a path for connecting capacitance to its own signal transmission node. This improves the precision of phase comparator, hindering malfunction.

First Modification of Second Embodiment

Figure 11:
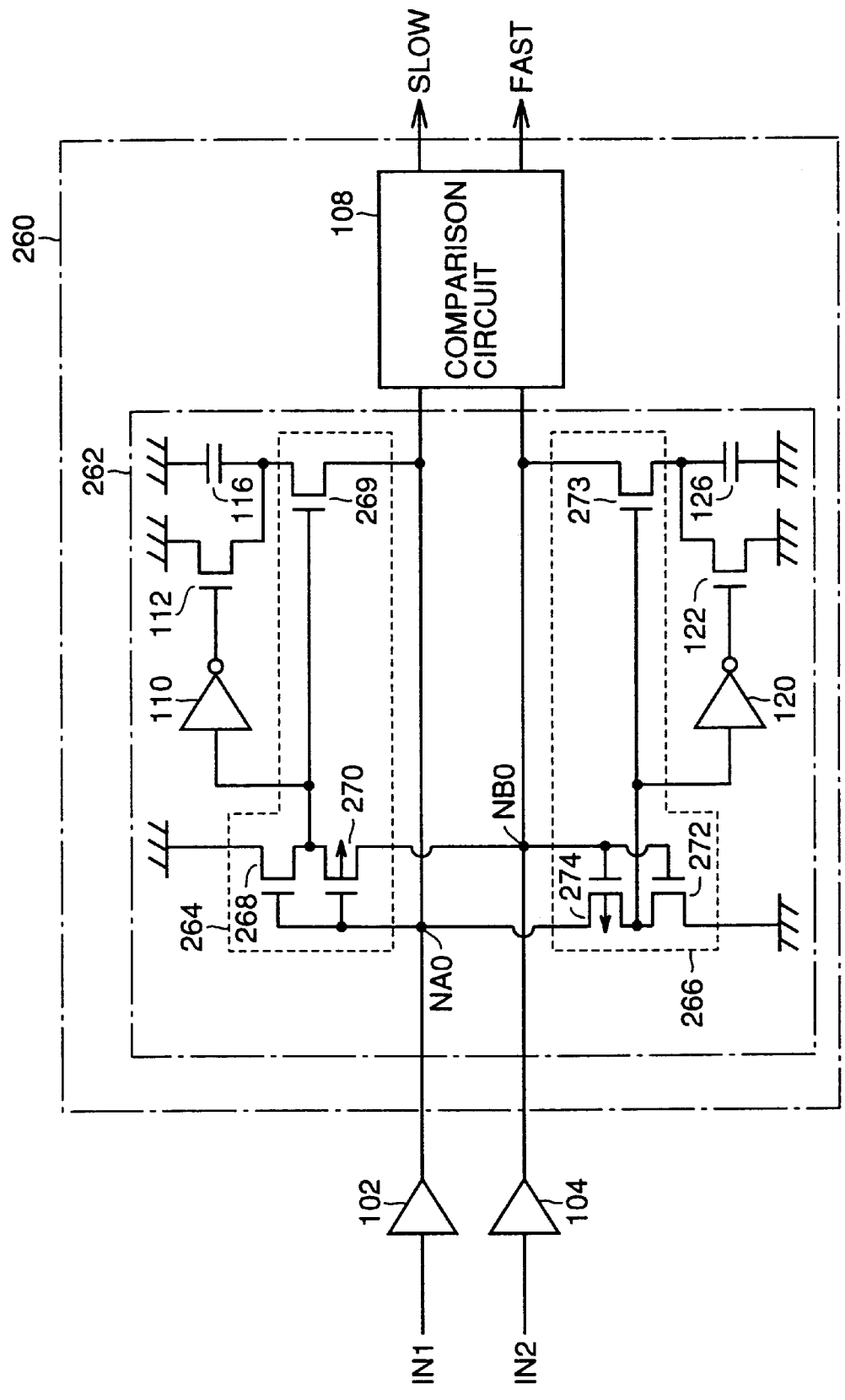
FIG. 11 is a circuit diagram showing a configuration of a phase comparator 260 that is a modification of the second embodiment.

FIG. 11 is a circuit diagram showing a configuration of a phase comparator 260 being the first modification of the second embodiment.

With reference to FIG. 11, phase comparator 260 includes a waveform processing circuit 262 instead of waveform processing circuit 252.

Waveform processing circuit 262 is identical to waveform processing circuit 252 shown in FIG. 9, except that it includes a connection circuit 264 instead of connection circuit 253, and a connection circuit 266 instead of connection circuit 257.

Connection circuit 264 includes a P channel MOS transistor 270 and an N channel MOS transistor 268 that are serially connected between node NB0 and the ground node and having their gates both connected with node NA0, and an N channel MOS transistor 269 that is connected between node NA0 and the drain of N channel MOS transistor 112 and having its gate connected to a connection node of P channel MOS transistor 270 and N channel MOS transistor 268.

The connection node of P channel MOS transistor 270 and N channel MOS transistor 268 is also connected to an input node of inverter 110.

Connection circuit 266 includes a P channel MOS transistor 274 and an N channel MOS transistor 272 serially connected between node NA0 and the ground node and having their gates both connected to node NB0, and an N channel MOS transistor 273 connected between node NB0 and the drain of N channel MOS transistor 122 and having its gate connected to a connection node of P channel MOS transistor 274 and N channel MOS transistor 272. The connection node of P channel MOS transistor 274 and N channel MOS transistor 272 is also connected to an input node of inverter 120. Other than described above, waveform processing circuit 262 has a configuration identical to that of waveform processing circuit 252 shown in FIG. 9, and thus, the description thereof will be not repeated.

Connection circuit 264 may have any other configuration as long as it serves as a circuit for connecting a capacitor to node NA0 when node NA0 is at an L level and node NB0 is at an H level. Similarly, connection circuit 266 has only to be a circuit connecting a capacitor to node NB0 only when node NA0 is at an H level and node NB0 is at an L level, and thus, other configurations can readily be considered.

In the first modification of the second embodiment, phase comparator 260 has waveform processing circuit 262 that is devoid of P channel MOS transistors 254, 256 compared with the waveform processing circuit shown in FIG. 9. Thus, it can control and keep small a resistance for connection between node NA0 and capacitor 116. The resistance for connection between node NB0 and capacitor 126 is made similarly small. Accordingly, phase comparator 260 is advantageous in terms of high-speed operation as well as space to be occupied on the semiconductor memory device, since connection circuits 264 and 266 can be made smaller than P channel MOS transistors 254 and 256 of FIG. 9.

Third Embodiment

The third embodiment refers to the case where the phase comparators according to the first and second embodiments are used in a DLL circuit generating an internal clock of a synchronous semiconductor memory device.

Figure 12:
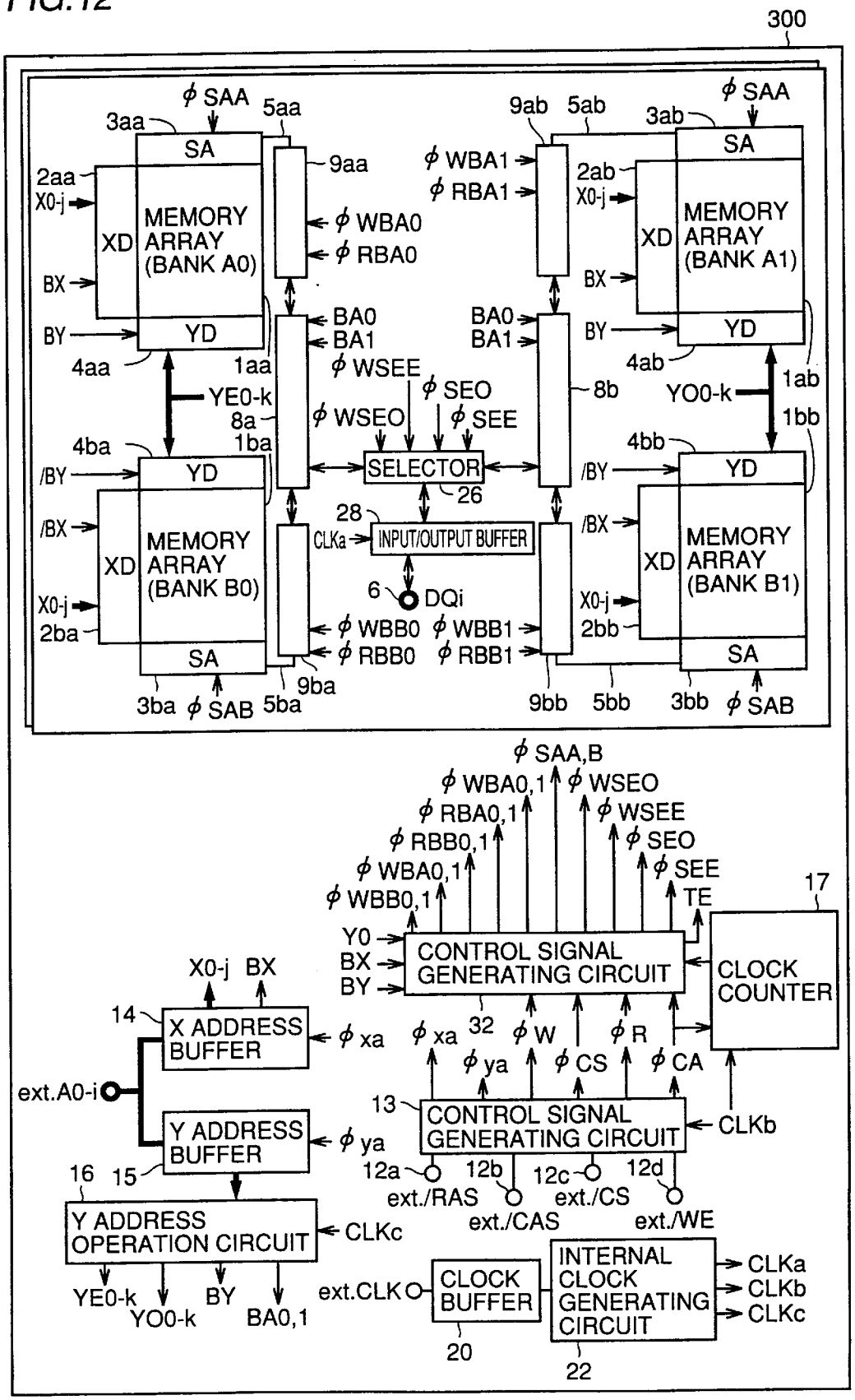
FIG. 12 is a block diagram schematically showing a configuration of a synchronous semiconductor memory device 300 according to a third embodiment of the present invention.

FIG. 12 is a block diagram schematically showing a configuration of a synchronous semiconductor memory device 300 according to the third embodiment.

In FIG. 12, the configurations of a portion associated with sending and receiving one-bit data and of peripheral circuits are shown. The portion associated with the sending and receiving of data is provided corresponding to a respective data input/output terminal.

Referring to FIG. 12, synchronous semiconductor memory device 300 includes memory arrays 1aa, 1ab, 1ba and 1bb, each having a plurality of memory cells arranged in rows and columns.

Synchronous semiconductor memory device 300 has two banks: a bank A consisting of memory arrays 1aa and 1ab, and a bank B consisting of memory arrays 1ba and 1bb.

In respective banks A and B, memory arrays 1aa, 1ab, 1ba and 1bb each constitute sub-banks A0, A1, B0 and B1, respectively.

Synchronous semiconductor memory device 300 functions as an SDRAM having two banks. Banks A and B can be driven to active/inactive states independent of each other. Designation of a bank is performed using a bank address that is provided at the same time as each command.

Memory array 1aa is provided with: an X decoder group 2aa that is activated by a bank address signal BX for decoding row address signals X0–Xj (X0–j) to drive an addressed row of memory array 1aa to a selected state; a sense amplifier group 3aa that is activated by a sense amplifier activating signal φSAA for sensing, amplifying and latching data in memory cells connected to the selected row of memory array 1aa; and a Y decoder group 4aa that is activated by a bank address signal BY for decoding column address signals YE0–YEk (YE0–k) to select an addressed column of memory array 1aa.

The memory cells on the column selected by this Y decoder group 4aa are coupled to an internal data bus 5aa. Bank address signal BX is a signal that is supplied at the same time as an active command or a pre-charge command that instructs return to a pre-charge state. Bank address signal BY is a signal that is supplied at the same time as a read command or a write command.

Memory array 1ab is provided with: an X decoder group 2ab that is activated by bank address signal BX for decoding row address signals X0–Xj (X0–j) to drive an addressed row of memory array 1ab to a selected state; a sense amplifier group 3ab that is activated by a sense amplifier activating signal φSAA for sensing, amplifying and latching data in memory cells connected to the selected row of memory array 1ab; and a Y decoder group 4ab that is activated by a bank address signal BY for decoding column address signals YO0–YOk (YO0–k) to select an addressed column of memory array 1ab.

The memory cells on the column selected by Y decoder group 4ab are coupled to internal data bus 5ab.

Memory array 1ba is provided with: an X decoder group 2ba that is activated by bank address signal /BX for decoding row address signals X0–Xj (X0–j) to drive an addressed row of memory array 1ba to a selected state; a sense amplifier group 3ba that is activated by a sense amplifier activating signal φSAB for sensing, amplifying and latching data in memory cells connected to the selected row of memory array 1ba; and a Y decoder group 4ba that is activated by a bank address signal /BY for decoding column address signals YE0–YEk (YE0–k) to select an addressed column of memory array 1ba.

The memory cells on the column selected by this Y decoder group 4ba are coupled to internal data bus 5ba.

Memory array 1bb is provided with: an X decoder group 2bb that is activated by bank address signal /BX for decoding row address signals X0–XJ (X0–j) to drive an addressed row of memory array 1bb to a selected state; a sense amplifier group 3bb that is activated by a sense amplifier activating signal φSAB for sensing, amplifying and latching data in memory cells connected to the selected row of memory array 1bb; and a Y decoder group 4bb that is activated by a bank address signal /BY for decoding column address signals YO0–YOk (YO0–k) to select an addressed column of memory array 1bb.

The memory cells on the column selected by this Y decoder group 4bb are coupled to internal data bus 5bb. Here, terms "X decoder group", "sense amplifier group" and "Y decoder group" are used because the X decoder group comprises X decoders arranged corresponding to respective rows, the sense amplifier group comprises sense amplifiers provided corresponding to respective columns in the corresponding memory array, and the Y decoder group includes Y decoders provided corresponding to respective columns.

In memory arrays 1aa and 1ab, memory cell select operations are conducted simultaneously according to bank address signals BX and BY, while in memory array 1ba and 1bb, the select operations are conducted simultaneously according to bank address signals /BX and /BY.

For reading data out of memory array 1aa, a write driver & pre-amplifier 9aa is provided. Write driver & pre-amplifier 9aa responds to activation of a register activation signal φRBA0, and receives, amplifies and latches data read out of memory array 1aa onto internal data bus 5aa by sense amplifier group 3aa. For writing data into memory array 1aa, write driver & pre-amplifier 9aa responds to activation of a register activation signal φWBA0, and receives, latches and outputs to internal data bus 5aa data supplied from a bank selector 8a.

For reading data from memory array 1ab, a write driver & pre-amplifier 9ab is provided. Write driver & pre-amplifier 9ab responds to activation of a register activation signal φRBA1, and receives, amplifies and latches data read from memory array 1bb onto internal data bus 5ab by sense amplifier group 3ab. For writing data into memory array 1ab, write driver & pre-amplifier 9ab also responds to activation of a register activation signal φWBA1, and receives, latches and outputs to internal data bus 5ab data supplied from a bank selector 8b.

For reading data from memory array 1ba, a write driver & pre-amplifier 9ba is provided. Write driver & pre-amplifier 9ba responds to activation of a register activation signal φRBB0, and receives, amplifies and latches data read out of memory array 1ba onto internal data bus 5ba by sense amplifier group 3ba. For writing data into memory array 1ba, write driver & pre-amplifier 9ba also responds to activation of a register activation signal φWBB0, and receives, latches and outputs to internal data bus 5ba data supplied from bank selector 8a.

For reading data from memory array 1bb, a write driver & pre-amplifier 9bb is provided. Write driver & pre-amplifier 9bb responds to activation of a register activation signal φRBB1, and receives, amplifies and latches data read out of memory array 1bb onto internal data bus 5bb by sense amplifier group 3bb. For writing data into memory array 1bb, write driver & pre-amplifier 9bb also responds to activation of a register activation signal φWBB1, and receives, latches and outputs to internal data bus 5bb data supplied from bank selector 8b.

Bank selector 8a is provided for write drivers & pre-amplifiers 9aa and 9ba. Bank selector 8a selects and outputs either one of data signals output from write drivers & pre-amplifiers 9aa and 9ba, according to data select signals BA0 and BA1.

Bank selector 8b is provided for write drivers & pre-amplifiers 9ab and 9bb. Bank selector 8b selects and outputs either one of data signals output from write drivers & pre-amplifiers 9ab and 9bb according to data select signals BA0 and BA1.

Provided for bank selectors 8a and 8b are: a selector 26 for selecting either output from bank selector 8a or 8b in response to select signals φSEO and φSEE at data reading; an input/output buffer 28 for receiving and amplifying an output of selector 26; and a data input/output terminal 6 for externally outputting an output signal of input/output buffer 28.

At data writing, in response to write select signals φWSEE and φWSEO, selector 26 outputs to bank selector 8a or 8b data that are externally input in synchronization with a clock signal CLKa via input/output buffer 28.

Synchronous semiconductor memory device 300 further includes a control signal generating circuit 13. It takes in, in synchronization with the rising of clock signal CLKb, external control signals ext./RAS, ext./CAS, ext./CS and ext./WE that are applied to input terminals 12a, 12b, 12c and 12d, respectively, determines their states, and generates internal control signals φxa, φya, φW, φCS, φR and φCA.

Signal ext./CS is a chip select signal. Synchronous semiconductor memory device 300 performs sending and receiving data when this chip select signal ext./CS is in an active state.

Clock signals CLKa, CLKb and CLKc are signals generated at internal clock generating circuit 22, according to external clock signal ext.CLK that is externally input/output via a clock buffer 20.

Signal φxa is activated when an active command is supplied, and instructs to take in a row address signal. Signal φya is activated when a read command or a write command is supplied, and directs to take in a column address signal. Signal φW is activated when a write command is supplied, and directs data writing. Signal φR is activated when an active command is supplied, and activates circuits in a portion associated with row selection. Signal φCA is activated when a read command or a write command is supplied, and activates circuits (column circuitry) in a portion associated with column selection as well as data output.

Synchronous semiconductor memory device 300 further includes: an X address buffer 14 for taking in external address signals ext.A0–Ai (A0–i) in response to activation of a row address take-in designating signal φxa and generating internal row address signals X0–Xj (X0–j) and bank address signal BX; a Y address buffer 15 activated in response to activation of a column address take-in designating signal φya for taking in external address signals ext. A0–Ai and generating an internal column address signal; and a Y address operation circuit 16 using the internal column address signal supplied from Y address buffer 15 as a leading address, changing this address in a prescribed sequence in synchronization with clock signal CLKc, and generating even-number column address signals YE0–YEk (YE0–k), odd-number column address signals YO0–YOk (YO0–k), and bank address signals BY, BA0, BA1 (BA0,1).

This Y address operation circuit 16 includes a burst address counter, and alters the column address signals every two clock cycles.

Synchronous semiconductor memory device 300 further includes: a clock counter 17 for counting internal clock signal CLKb according to the activation of a column system activation signal φCA, and generating a count up signal at a prescribed timing according to the counted value; and a control signal generating circuit 32 for receiving the count up signal from clock counter 17, bank address signals BX and BY, and the least significant bit Y0 of the column address signal, and generating various internal control signals φRBB0, φRBB1, φRBA0, φRBA1, φSAA, φSAB, φSEO, φSEE, φWBB0, φWBB1, φWBA0, φWBA1, φWSEO, and φWSEE.

A control signal for the designated bank is set at an active state according to bank address signals BX and BY. Least significant bit Y0 of column address signal is used to indicate which memory array out of two memory arrays included in one bank is to be accessed first.

Clock counter 17 includes a counter for counting CAS latencies and burst length, and generates the count up signal at a prescribed timing according to a designated operation mode.

Figure 13:
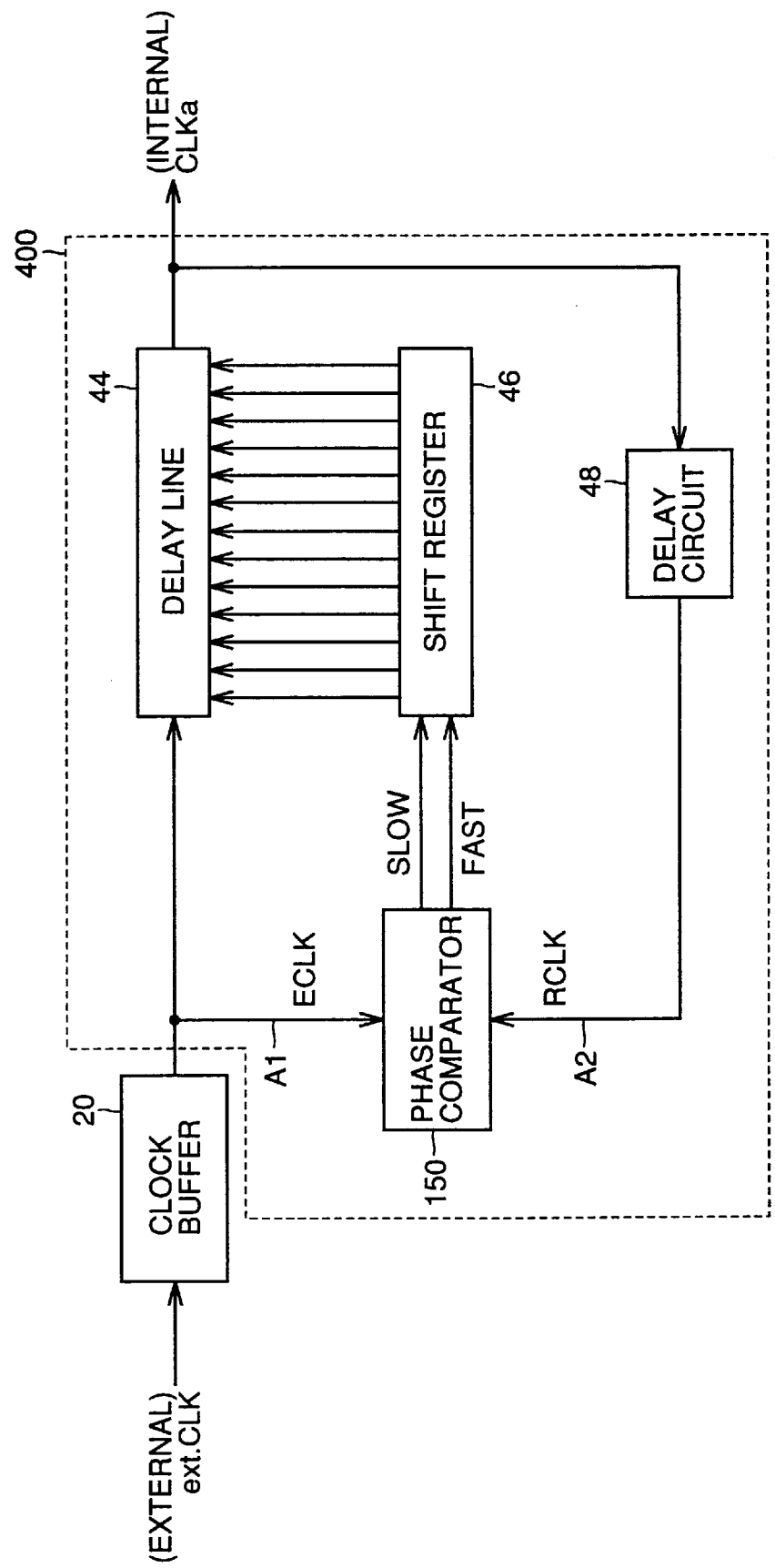
FIG. 13 is a block diagram schematically showing a DLL circuit 400 included in an internal clock generating circuit 22 of synchronous semiconductor memory device 300.

FIG. 13 is a block diagram showing a schematic configuration of a DLL circuit 400 included in internal clock generating circuit 22 of synchronous semiconductor memory device 300.

Referring to FIG. 13, DLL circuit 400 includes: a delay line 44 for receiving and delaying a clock signal ECLK that is output from clock buffer 20 receiving external clock signal ext.CLK, and for outputting internal clock signal CLKa; and a delay circuit 48 for delaying internal clock signal CLKa by a time period that is equivalent to an amount of delay to be produced (hereinafter, referred to as delay amount) at clock buffer 20 or the like, and for outputting a clock signal RCLK.

DLL circuit 400 further includes a phase comparator 150 for comparing phases of clock signals ECLK and RCLK and outputting signals SLOW, FAST corresponding to the result of comparison, and a shift register 46 for changing the delay amount of the delay line in response to signals SLOW, FAST.

Though phase comparator 150 shown in the first embodiment has been used in FIG. 13, any one of phase comparators 210, 250, or 260 shown in the first or second embodiment may be used instead.

The operation will now be described in brief. In the case where clock signal RCLK corresponding to internal clock signal CLKa is lagging behind clock signal ECLK corresponding to external clock signal ext.CLK, the phase comparator outputs a pulse as signal SLOW. Here, signal FAST does not change. Shift register 46 responds to signal SLOW and decreases the delay amount of delay line to advance internal clock signal CLKa.

Conversely, in the case where clock signal RCLK is too much advanced in phase with respect to clock signal ECLK, the phase comparator outputs a pulse as signal FAST, and signal SLOW does not change. Shift register 46 responds to signal FAST and increases the delay amount of delay line so as to make internal clock signal CLKa lag.

Figure 14:
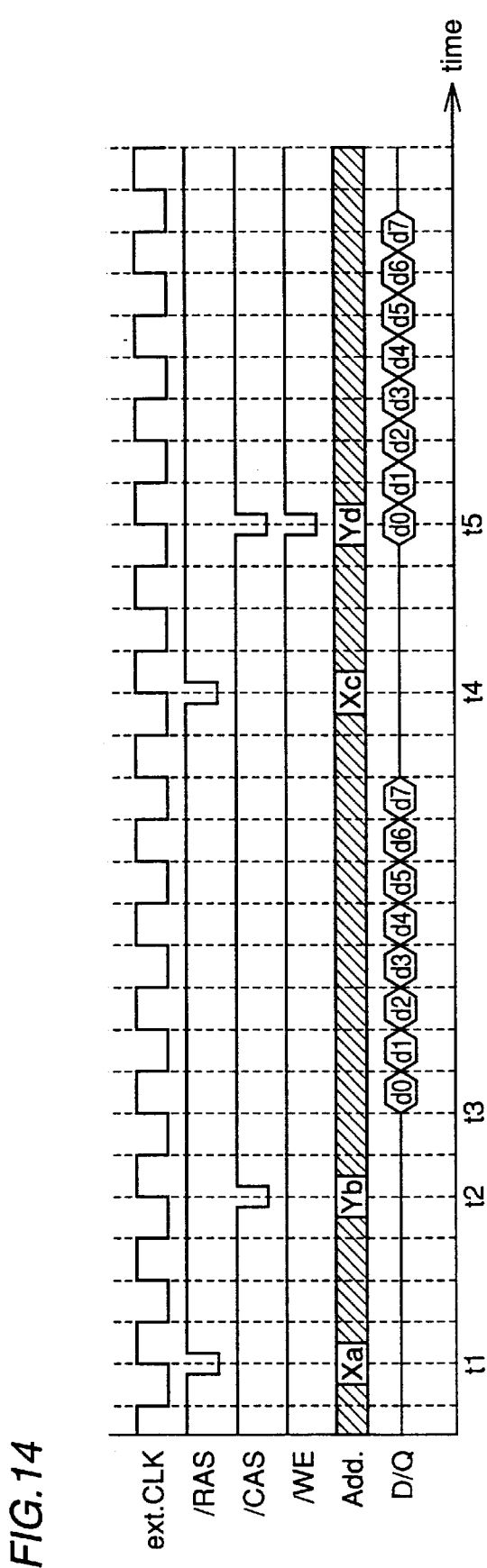
FIG. 14 shows waveforms illustrating typical timing for satisfying the successive access specification of synchronous semiconductor memory device 300.

FIG. 14 shows waveforms illustrating a typical timing satisfying the successive access specification of synchronous semiconductor memory device 300.

FIG. 14 illustrates an operation in an SDRAM permitting input/output of 8-bit data (byte data) via data input/output terminals DQ0 to DQ7, for successively writing or reading 8 pieces of data (a total of 64 bits by 8×8). The number of bits of data to be read out continuously is called "burst length," which can normally be modified by a mode register in SDRAM.

With reference to FIG. 14, at time t1, externally applied control signals (row address strobe signal /RAS, column address strobe signal /CAS, address signal ADD, and so on) are taken into SDRAM at the rising edge of externally applied clock signal ext.CLK (e.g., system clock). Since row address strobe signal /RAS is in an active state at an L level, address signal ADD at this time is taken in as a row address Xa.

At time t2, column address strobe signal /CAS attains an active state at an L level, and is taken within SDRAM in synchronization with the rising of clock signal ext.CLK. At this time, address signal ADD is taken in as a column address Yb. According to row address Xa and column address Yb thus taken in, row and column select operations are performed within SDRAM.

A data signal input/output via an input/output terminal DQi is designated as D/Q. At time t3, a prescribed clock period (3 clock cycles in FIG. 4) has passed after row address strobe signal /RAS fell to an L level, the first data d0 is output, and then, data d1 to d7 are output successively. The data are output from the terminal according to the rising and falling of clock signal CLKa that is generated at the internal DLL circuit in response to clock signal ext.CLK.

Accordingly, discrepancy in timing between the data output timing and external clock signal ext.CLK can be suppressed small, and thus, other semiconductor devices connected to synchronous semiconductor memory device 300 can receive data at high speed.

Writing operation is illustrated from time t4 onward. At time t4, row address Xc is taken into SDRAM. At time t5, if column address strobe signal /CAS and write enable signal /WE are both in an active state at an L level, column address Yd is taken in at the rising edge of clock signal ext.CLK, and at the same time, data d0 having been currently provided is taken in as the first write data. Thus, in response to the falling of row address strobe signal /RAS and column address strobe signal /CAS, row and column select operations are conducted within SDRAM. Thereafter, input data d1 to d7 are taken in sequentially in synchronization with the rising and falling of clock signal ext.CLK, and are written into corresponding memory cells.

In synchronous semiconductor memory device 300 according to the third embodiment, data are output from the terminal according to clock signal CLKa generated in internal DLL circuit 400 in response to clock signal ext.CLK.

Therefore, discrepancy in timing between the data output timing and external clock signal ext.CLK can be suppressed small. Other semiconductor devices connected to synchronous semiconductor memory device 300 can thus take in data rapidly in synchronization with external clock signal ext.CLK.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase comparator, comprising:
   a waveform processing circuit for modifying, based on a phase difference between a first input signal and a second input signal, a waveform of at least one of said first and second input signals to enlarge said phase difference for application to first and second internal nodes, respectively,
   said waveform processing circuit including
      a first gate circuit for transmitting said first input signal to said first internal node when said first input signal makes a transition prior to said second input signal, and for connecting said first internal node to a power supply node when said second input signal makes a transition prior to said first input signal, and a second gate circuit for transmitting said second input signal to said second internal node when said second input signal makes a transition prior to said first input signal, and for connecting said second internal node to said power supply node when said first input signal makes a transition prior to said second input signal; and a comparison circuit for performing phase comparison between said first input signal and said second input signal based on a potential of said first internal node and a potential of said second internal node.

2. The phase comparator according to claim 1, wherein said first gate circuit includes a first MOS transistor connected between said first internal node and said power supply node and rendered conductive in accordance with said second input signal;

said second gate circuit includes a second MOS transistor connected between said second internal node and said power supply node and rendered conductive in accordance with said first input signal; and said first and second input signals are applied to said first and second internal nodes, respectively.

3. The phase comparator according to claim 1, wherein said comparison circuit senses that said second signal is lagging behind said first input signal in phase when said second input signal makes a state transition from a first logic value to a second logic value while said first in put signal is at said second logic value.

4. The phase comparator according to claim 3, wherein said comparison circuit includes a first latch circuit responsive to said second input signal for receiving a signal on said second internal node, a second latch circuit responsive to said first input signal for receiving an output of said first latch circuit, a pulse generating circuit for generating a pulse in response to said first input signal, and a gate circuit for sampling an output value of said second latch circuit at a timing of the pulse output from said pulse generating circuit, and for outputting an output signal of said comparison circuit.

5. The phase comparator according to claim 3, wherein said comparison circuit includes a first latch circuit responsive to said second input signal for receiving a signal on said second internal node and a signal on said first internal node as signals complementary to each other, a second latch circuit responsive to said first input signal for receiving an output of said first latch circuit, a pulse generating circuit for generating a pulse in response to said first input signal, and a gate circuit for sampling an output value of said second latch circuit at a timing of the pulse output from said pulse generating circuit, and for outputting an output signal of said comparison circuit.

6. A phase comparator, comprising:

a waveform processing circuit for modifying, based on a phase difference between a first input signal and a second input signal, a waveform of at least one of said first and second input signals to enlarge said phase difference for application to first and second internal nodes, respectively, said waveform processing circuit including a first gate circuit for transmitting said first input signal to said first internal node when said first input signal makes a transition prior to said second input signal, and for connecting a capacitive load to said first internal node when said second input signal makes a transition prior to said first input signal, and a second gate circuit for transmitting said second input signal to said second internal node when said second input signal makes a transition prior to said first input signal, and for connecting a capacitive load to said second internal node when said first input signal makes a transition prior to said second input signal; and a comparison circuit for performing phase comparison between said first input signal and said second input signal based on a potential of said first internal node and a potential of said second internal node.

7. The phase comparator according to claim 6, wherein said first gate circuit includes a first connection circuit for connecting said first internal node to a third internal node when a logic value at said second internal node is a first logic value and a logic value at said first internal node is a second logic value, and a first capacitor, as the capacitive load, connected between said third internal node and a power supply node; and said second gate circuit includes a second connection circuit for connecting said second internal node to a fourth internal node when the logic value at said first internal node is said first logic value and the logic value at said second internal node is said second logic value, and a second capacitor, as the capacitive load, connected between said fourth internal node and a power supply node.

8. The phase comparator according to claim 7, wherein said first connection circuit includes a first P channel MOS transistor and a first N channel MOS transistor serially connected between said first internal node and said third internal node and having gates connected to said first internal node and said second internal node, respectively, and said second connection circuit includes a second P channel MOS transistor and a second N channel MOS transistor serially connected between said second internal node and said fourth internal node and having gates connected to said second internal node and said first internal node, respectively.

9. The phase comparator according to claim 7, wherein said first connection circuit includes a first P channel MOS transistor and a first N channel MOS transistor serially connected between said second internal node and said power supply node and having gates both connected to said first internal node, and a third N channel MOS transistor connected between said first internal node and said third internal node and having a gate connected to a connection node of said first P channel MOS transistor and said first N channel MOS transistor; and said second connection circuit includes
- a second P channel MOS transistor and a second N channel MOS transistor serially connected between said first internal node and said power supply node and having gates both connected to said second internal node, and
- a fourth N channel MOS transistor connected between said second internal node and said fourth internal node and having a gate connected to a connection node of said second P channel MOS transistor and said second N channel MOS transistor.

10. The phase comparator according to claim 6, wherein said comparison circuit senses that said second input signal is lagging behind said first input signal in phase when said second input signal makes a state transition from a first logic value to a second logic value while said first input signal is at said second logic value.

11. The phase comparator according to claim 10, wherein said comparison circuit includes
- a first latch circuit responsive to said second input signal for receiving a signal on said second internal node,
- a second latch circuit responsive to said first input signal for receiving an output of said first latch circuit,
- a pulse generating circuit for generating a pulse in response to said first input signal, and
- a gate circuit for sampling an output value of said second latch circuit at a timing of the pulse output from said pulse generating circuit, and for outputting an output signal of said comparison circuit.

12. The phase comparator according to claim 10, wherein said comparison circuit includes
- a first latch circuit responsive to said second input signal for receiving a signal on said second internal node and a signal on said first internal node as signals complementary to each other,
- a second latch circuit responsive to said first input signal for receiving an output of said first latch circuit,
- a pulse generating circuit for generating a pulse in response to said first input signal, and
- a gate circuit for sampling an output value of said second latch circuit at a timing of the pulse output from said pulse generating circuit, and for outputting an output signal of said comparison circuit.

13. A synchronous semiconductor memory device operating in synchronization with an external clock signal, comprising:
- a memory cell array having a plurality of memory cells arranged in a matrix;
- an output circuit for outputting data held in said memory cells in synchronization with an internal clock signal that is synchronized in phase with said external clock signal; and
- an internal clock generating circuit for generating said internal clock signal, said internal clock generating circuit including
- a delay control circuit for controlling generation of said internal clock from said external clock,
- a delay line controlled by said delay control circuit for delaying said external clock signal and outputting said internal clock, and
- a phase comparator for detecting a phase difference between said external clock signal and said internal clock signal and outputting a result of detection to said delay control circuit, said phase comparator including
- a waveform processing circuit for modifying, based on a phase difference between a first input signal generated according to said external clock signal and a second input signal generated according to said internal clock signal, a waveform of at least one of said first and second input signals to enlarge said phase difference for application to first and second internal nodes, respectively, said waveform processing circuit including
- a first gate circuit for transmitting said first input signal to a first internal node when said first input signal makes a transition prior to said second input signal, and connecting said first internal node to a power supply node when said second input signal makes a transition prior to said first input signal, and
- a second gate circuit for transmitting said second input signal to the second internal node when said second input signal makes a transition prior to said first input signal, and for connecting said second internal node to said power supply node when said first input signal makes a transition prior to said second input signal, and
- a comparison circuit for performing phase comparison between said first input signal and said second input signal based on a potential of said first internal node and a potential of said second internal node.

14. The synchronous semiconductor memory device according to claim 13, wherein said first gate circuit includes
- a first MOS transistor connected between said first internal node and said power supply node and rendered conductive in accordance with said second input signal;

said second gate circuit includes
- a second MOS transistor connected between said second internal node and said power supply node and rendered conductive in accordance with said first input signal; and said first and second input signals are provided to said first and second internal nodes, respectively.

15. The synchronous semiconductor memory device according to claim 13, wherein
said comparison circuit senses that said second input signal is lagging behind said first input signal in phase when said second input signal makes a state transition from a first logic value to a second logic value while said first input signal is at said second logic value.

16. The synchronous semiconductor memory device according to claim 15, wherein
said comparison circuit includes
- a first latch circuit responsive to said second input signal for receiving a signal on said second internal node,
- a second latch circuit responsive to said first input signal for receiving an output of said first latch circuit,
- a pulse generating circuit for generating a pulse in response to said first input signal, and a gate circuit for sampling an output value of said second latch circuit at a timing of the pulse output from said pulse generating circuit, and for outputting an output signal of said comparison circuit.

17. The synchronous semiconductor memory device according to claim 15, wherein said comparison circuit includes a first latch circuit responsive to said second input signal for receiving in a signal on said second internal node and a signal on said first internal node as signals complementary to each other, a second latch circuit responsive to said first input signal for receiving an output of said first latch circuit, a pulse generating circuit for generating a pulse in response to said first input signal, and a gate circuit for sampling an output value of said second latch circuit at a timing of the pulse output from said pulse generating circuit, and for outputting an output signal of said comparison circuit.

* * * * *